United States Patent [19]

Slutz

[11] Patent Number: 5,491,002
[45] Date of Patent: Feb. 13, 1996

[54] MULTILAYER CVD DIAMOND FILMS

[75] Inventor: David E. Slutz, Columbus, Ohio

[73] Assignee: General Electric Company, Worthington, Ohio

[21] Appl. No.: 400,555

[22] Filed: Mar. 8, 1995

Related U.S. Application Data

[63] Continuation of Ser. No. 128,042, Sep. 27, 1993, abandoned, which is a continuation of Ser. No. 855,391, Mar. 20, 1992, abandoned.

[51] Int. Cl.⁶ .............................. C23C 16/00; H05H 1/24
[52] U.S. Cl. .................. 427/249; 427/255.1; 427/255.7; 427/314; 427/577; 427/419.7; 423/446; 428/408
[58] Field of Search .................. 427/249, 255.7, 427/255.1, 577, 314, 419.7; 423/446; 428/408; 117/920

[56] References Cited

U.S. PATENT DOCUMENTS 5,135,807  8/1992  Ito et al. .................. 428/334

FOREIGN PATENT DOCUMENTS

| | | |
|---|---|---|
| 0413834 | 2/1991 | European Pat. Off. . |
| 61-163273 | 7/1986 | Japan . |
| 61-163275 | 7/1986 | Japan . |
| 63-106703 | 5/1988 | Japan . |
| 1087559 | 3/1989 | Japan . |
| 2173264 | 7/1990 | Japan . |
| 3-055165 | 3/1991 | Japan . |
| 3-141193 | 6/1991 | Japan . |

OTHER PUBLICATIONS

Proceedings of the IEEE vol. 79., No. 5, May 1991, N.Y. U.S. pp. 621–646, XP240229.

*Primary Examiner*—Roy V. King

[57] ABSTRACT

Multilayer CVD diamond films are provided, wherein grain boundaries of the diamond layers are interrupted by renucleating and growing diamond on new nucleation sites comprised of metal. These nucleation sites are positioned on the interface between diamond layers. Methods for producing these multilayer CVD diamond films are also provided wherein the diamond growth on a substrate is interrupted by the deposition of metals which provide new nucleation sites. Diamond growth is then reinitiated.

2 Claims, No Drawings

MULTILAYER CVD DIAMOND FILMS

This is a continuation of Ser. No. 08/128,042 filed on Sep.27, 1993 which is a continuation of Ser. No. 07/855,391 filed on Mar. 20, 1992 both of them now abandoned.

BACKGROUND OF THE INVENTION

This invention relates to improved multilayer CVD diamond films and methods for making same. More particularly, the present invention relates to multilayer CVD diamond film wherein diamond nucleation sites comprised of metal are positioned between the diamond layers. This is accomplished by interrupting the growth of CVD diamond and depositing a metal to serve as a new diamond nucleation site.

Recently, industrial effort directed toward the grown of diamond at low pressures, where it is metastable, has increased dramatically. Although the ability to produce diamond by low pressure synthesis techniques has been known for decades, drawbacks, including extremely low growth rates, prevented wide commercial acceptance. Recent developments have led to higher growth rates, thus spurring recent industrial interest in the field. Additionally, the discovery of an entirely new class of solids, known as "diamond-like" carbons and hydrocarbons, is an outgrowth of such recent work.

Low pressure growth of diamond has been dubbed "chemical vapor deposition" or "CVD" in the field. Two predominant CVD techniques have found favor in the literature. One of these techniques involves the use of a dilute mixture of hydrocarbon gas (typically methane) and hydrogen, wherein the hydrocarbon content usually is varied from about 0.1% to 2.5% of the total volumetric flow. The gas is introduced via a tube located just above a hot tungsten filament which is electrically heated to a temperature ranging from between about 1750°–2400° C. The gas mixture disassociates at the filament surface, and diamonds are condensed onto a heated substrate placed just below the hot tungsten filament. The substrate is held in a resistance heated boat (often molybdenum) and heated to a temperature in the region of about 500°–1100° C.

Reference is made to U.S. Pat. No. 4,434,188, which describes a CVD process of causing diamond nucleation and growth from a heated gas mixture in contact with a substrate.

The second technique involves the imposition of a plasma discharge to the foregoing filament process. The plasma discharge serves to increase nucleation density and growth rate, and it is believed to enhance formation of diamond films, as opposed to discrete diamond particles. Of the plasma systems that have been utilized in this area, there are three basic systems. One is a microwave plasma system, the second is an RF (inductively or capacitively coupled) plasma system, and the third is a d.c. plasma system. The RF and microwave plasma systems utilize relatively complex and expensive equipment, which usually requires complex tuning or matching networks to electrically couple electrical energy to the generated plasma. Additionally, the diamond growth rate offered by these two systems can be quite modest.

Reference is made to application Ser. No. 06/944,729 of Anthony et al., filed Dec. 22, 1986 now abandoned, assigned to the same assignee as the present invention, which discloses a method and apparatus by which diamond crystals are caused to nucleate and grow on a substrate by means of a heated filament and luminescent gas plasma activated hydrogen-hydrocarbon gas mixture. The gas mixture is subjected to concurrent activation by an incandescent tungsten wire electrical resistance heater and by electromagnetic microwave energy to become a luminescent gas plasma with a significant atomic hydrogen content. The activated gas mixture is brought into contact with a heated substrate, and, as a consequence thereof, diamond crystals are formed or nucleated on the substrate from the activated gas mixture, which is followed by diamond crystal growth.

In general, processes for the chemical vapor deposition of diamond involve the selection of operating parameters, such as the selection of a precursor gas and diluent gases; the mixture proportions of the gases; gas temperature and pressure; substrate temperature; and means of gas activation. These parameters are adjusted to provide diamond nucleation and growth on a substrate. Parameters which affect diamond nucleation and growth have been investigated. For example, it is known that the CVD diamond tends to nucleate on certain materials more readily than others such as silicon and its compounds.

It is also known that if the hydrocarbon concentration (methane) is increased above 3%, graphite deposition becomes more evident.

The surface chemistry of diamond growth has also been investigated. For example, it is well known in the art of CVD diamond that atomic hydrogen is necessary to stabilize the surface of diamond film by terminating the carbon atoms with hydrogen and preserving the sp3 bonding of carbon. If the supply of atomic hydrogen is not present, the surface of the diamond film will become more complex, forming other types of bonding such as sp2 and sp.

CVD diamond films grow epitaxially using conventional methods.

This allows the grain boundaries between individual crystals to lie in a plane through the thickness of the diamond layer. These boundaries are regions of lower strength; therefore, cracks can propagate more easily through them. Since there is no interruption of the grain boundaries through the thickness of the layer, layers tend to crack and fall apart. If the grain boundaries were interrupted and the diamond film multilayered, crack propagation would be more difficult in such a film, and the structure would give the film more transverse strength.

Methods wherein the growth of diamond is interrupted or growth conditions are varied may provide some interruption of the grain boundaries. These processes typically have other objectives. For example, diamond growth is interrupted in some processes to remove graphite and the hydrocarbon/hydrogen ratio in the gas mixture is varied in some processes to maintain fine grains. However, by simply interrupting or altering the growth phase, it is possible for the new diamond growth to maintain the same grain boundaries. Where there is some disruption of the grain boundaries and multilayered films are formed, there may be weaknesses in the film if upon renucleation some of the grain boundaries are maintained. It is desirable to provide a multilayer diamond film of reliable strength which is greater than conventional CVD diamond films.

SUMMARY OF THE INVENTION

It is an object of this invention to produce a multilayer CVD diamond film of reliable strength having all grain boundaries interrupted at each layer and preferably having grains of uniform size.

It is another object of this invention to provide a method for producing high strength, multilayer CVD diamond films in a consistent and uniform manner.

Upon further study of the specification and appended claims, further objects and advantages of this invention will become apparent to those skilled in the art.

The multilayer CVD diamond films of this invention have new diamond nucleating sites at an interface between layers of diamond film. These new nucleating sites are comprised of metal and provide new regions of growth for the subsequent diamond layer. The metal deposited on the diamond provides new growth patterns with new grain boundaries, thus interrupting all existing grain boundaries. The method for producing such films comprises interrupting the diamond growth phase of a CVD diamond process, depositing a metal on the diamond surface by chemical vapor deposition, and reinitiating the diamond growth phase.

DETAILED DESCRIPTION OF THE PREFERRED EMBODIMENTS

The multilayer CVD diamond films of this invention can be of a size and configuration which are conventional for CVD diamond film. This is possible because the multilayer films can be produced in conventional CVD equipment, these films will typically have a thickness of from 1–1000 µm and a surface area of from 1–3.00 cm$^2$. However, much larger and thicker films can be obtained if desired. The surface area is determined by the size of the substrate upon which the CVD diamond is deposited. This substrate is typically limited in size due to difficulties in removing the film formed thereon.

The individual diamond layers within the CVD diamond film can vary in thickness, uniformity, and continuity. Typically, diamond layers will vary from 0.01 to 1000 µm in thickness. The number of diamond layers can vary widely, from as low as 2 to more than 1000. To obtain the maximum benefit from the present invention, the thickness of any one layer should not be so large as to form a large grain boundary. Large numbers of layers are conveniently obtained in those apparatus which provide for cyclical (on/off) operation of a CVD diamond growth process.

The multilayer diamond films of the present invention have diamond nucleation sites positioned at an interface between layers of diamond film. These nucleation sites are comprised of a non-diamond material, typically a metal and preferably a carbide-forming metal. The carbide-forming metal can react with the diamond, forming a strong bond thereto. This is desirable so as to avoid weaknesses within the diamond film. Preferred carbide formers include titanium, zirconium, hafnium, vanadium, niobium, tantalum, chromium, molybdenum, tungsten, and silicon. These metals can also be used in the form of borides, carbides, and nitrides. These carbide formers are desired since they will readily bond to the carbon atoms, terminating diamond growth. As carbide formers, they are expected to readily start up new growth. The carbide-forming metals are easily deposited on diamond at the interfaces, and diamond is known to readily nucleate on these materials. Particular advantage may be obtained with titanium, tungsten, silicon, and molybdenum.

The metals used as nucleation sites can be distributed over the interface between layers of diamond in a non-continuous fashion which does not cover the diamond interface completely, or these metals can be deposited to form a continuous film over the interface. Continuous films further insure all grain boundaries are interrupted but may not be preferred since the carbide bond is weaker than the carbon-carbon bonds of diamond. The thickness of the metal layer is preferably small so as not to detract from the strength of the diamond film. Layers of less than 0.1 micron are preferred, and layers of less than 0.01 microns may be more preferred for some embodiments.

The metals used as nucleation sites need only be positioned at one of many interfaces between diamond layers to provide improvement. It may be desirable to nucleate new growth at other interfaces without a metal to economize or accelerate the synthesis procedure. The metals used as nucleation sites can be positioned at each interface of the diamond layers in the film if desired.

In certain embodiments, it may be desirable for some of the metals used as nucleation sites to be dispersed within one or more layers of the diamond film. The dispersed metals may be desired to provide a concentration gradient at the interface of the diamond layers. They may also serve to further disrupt the diamond growth patterns and grain boundaries, providing fine grain diamond layers. To obtain a dispersion of the metals, the metals in the diamond layers can be deposited simultaneously with the deposition of the carbon for diamond. This may be unavoidable when producing the multilayer diamond films utilizing some deposition techniques and equipment as the layering cycle is repeated.

The multilayer diamond films of this invention are distinct from configurations generally known as laminates in that all layers are chemically bonded to each other.

The method for synthesizing the multilayer CVD diamond films provided by this invention employs a diamond growth phase. This can be accomplished by conventional CVD diamond growth processes, wherein a substrate is heated and contacted with an excited hydrocarbon-hydrogen gas mixture under conditions of pressure, temperature, and gas concentration which promote diamond nucleation and growth on such substrate.

Conventional starting materials and process conditions are suitable for the diamond growth phase. For example, hydrocarbon sources can include alkane series gases, such as methane, ethane, and propane; unsaturated hydrocarbons, such as ethylene, acetylene, cyclohexene, and benzene; and the like. Methane, however, is preferred. The molar ratio of hydrocarbon to hydrogen broadly ranges from about 1:10 to 1:1000 and about 1:100 being preferred. This gaseous mixture optionally may be diluted with an inert gas such as argon. Growth rates in the range of about 0.1 to 10 microns per hour have been easily obtained at energy requirements of only about 40 W/cm$^2$. Growth rates greater than 10 microns per hour can be used at higher energy costs.

The gas mixture which impinges the substrate can be excited by simply directing it across a hot filament heated by electrical resistance, preferably positioned in close proximity to the substrate. Alternatively or in addition thereto the gas mixture can be ionized to form a gas plasma with microwave or RF energy. The hot filaments are typically heated to a temperature between 1500°–2500° C.

The substrate temperature utilized for diamond growth typically ranges from about 500°–1100° C. and is preferably in the range of 750°–900° C. Pressures for the gaseous admixture generally range up to about 760 Torr. Further details on conventional process conditions suitable for use herein can be found in U.S. Pat. No. 4,707,384 to Angus et al.; "Low Pressure Metastable Growth of Diamond and Diamond-Like Phases", *Science*, Vol. 241, pp. 913–921

(Aug. 19, 1988); and Bachman et al., "Thin Diamond Films", *Chemical Engineering News*, pp 24–39 (May 15, 1989).

This diamond growth phase is interrupted at least once to deposit a metal by chemical vapor deposition on the surface of the diamond layer. This can be accomplished by conventional deposition techniques for the metal selected. The starting materials will typically be hydrogen and the metal in multivalent form such as tungsten hexafluoride, molybdenum hexafluoride, or silane. Any of the carbide-forming metals described above can be used in the process of this invention.

Once the nucleation sites have been deposited, the diamond growth phase is reinitiated to renucleate diamond and grow another layer.

For practical reasons, the deposition of metal preferably takes place in the same CVD reactor. This minimizes handling and allows multilayered film with a large number of layers to be easily formed. Deposition of the metal can be accomplished in conventional CVD reactors by simply terminating the hydrocarbon feed (methane) and feeding the multivalent metal starting materials. Apparatus specifically adapted for cyclization of reaction conditions can also be used.

The metal can be dispersed over the diamond surface, or it can be uniformly deposited to form a complete layer at the interface between diamond layers. The metal layers formed are thin, and deposition preferably does not take more than one hour so that diamond growth can continue. The metal is preferably deposited in an amount which provides more diamond nucleation sites than the diamond surface itself. This should be sufficient to provide new diamond growth patterns with new grain boundaries in the diamond layers formed.

In depositing the metal by CVD techniques, it forms a metal carbide bond with a carbon atom on the diamond surface. If the metal is used in boride, nitride, or carbide form, these complexes may remain bound to the metal. The metal may be codeposited with diamond in certain embodiments where the hydrocarbon reactants are partially replaced with the multivalent metal starting materials for forming nucleation sites.

An example of an apparatus suitable for the synthesis of the multilayer CVD diamond films provided by this invention comprises a substrate of a carbide- or hydride-forming metal, a sealed reaction chamber wherein the substrate is positioned, means for heating the substrate, means for impinging the heated substrate with an admixture of hydrocarbon-hydrogen gas, means for exciting the gas which impinges this substrate for diamond nucleation and growth, and means for impinging the heated substrate with a gas admixture of metal halide or metal hydride and hydrogen.

The reaction chamber is preferably comprised of quartz or stainless steel and provides access to the substrate supported therein. The substrate is preferably heated by electrical resistance. The means for heating the substrate need only comprise a means for providing an electric current therethrough. An alternative is to utilize a resistance heated boat or a separate resistance heater. Reflectors may optionally be positioned within the reactor to help control heating of the substrate. The gas admixtures are introduced into the reaction chamber, directed at the substrate for impingement, and exhausted out of the reaction chamber utilizing simple conduits, preferably comprised of quartz. A hot filament heated by electrical resistance is preferably used to excite the gases and is preferably positioned in close proximity to the substrate. Alternative means include ionization of the gas with microwave or RF energy to form a gas plasma. The components and configuration of the apparatus used can vary widely. Examples of other suitable configurations are described in the following references: Ser. No. 07/198,966, filed May 26, 1988 now abandoned; Ser. No. 07/664,153, filed Mar. 4, 1991 now abandoned, both assigned to the same assignee as the present invention and U.S. Pat. No. 4,830,702.

This invention produces CVD diamond films with higher transverse strengths, fewer cracks, and lower residual stresses than the films presently being produced. In addition, this will give manufacturers the ability to fabricate diamond films tailor-made for certain applications by controlling the microstructure of the diamond films.

Without further elaboration, it is believed that one skilled in the art can, using the preceding description, utilize the present invention to its fullest extent. The following preferred specific embodiments are, therefore, to be construed as merely illustrative and not limitative of the remainder of the disclosure in any way whatsoever.

The entire disclosure of all applications, patents, and publications, cited above and below, are hereby incorporated by reference.

What is claimed is:

1. A method for forming a multilayer chemical vapor deposited (CVD) diamond film, consisting essentially of the steps of:

(1) depositing diamond on a heated substrate by impingement with an excited hydrocarbon-hydrogen gas mixture under conditions of temperature, pressure and gas concentration which promote diamond nucleation and growth on the substrate;

(2) interrupting the diamond growth of said step (1);

(3) depositing a metal carbide layer of less than 0.01 microns suitable for nucleating diamond on the diamond formed in said step (1); and (4) reinitiating said step (1).

2. A method as in claim 1, wherein the metal in the metal carbide layer is selected from the group consisting of titanium, zirconium, hafnium, vanadium, niobium, tantalum, molybdenum, and tungsten.

* * * * *